United States Patent
Joseph

(10) Patent No.: US 9,081,915 B2
(45) Date of Patent: Jul. 14, 2015

(54) MODAL ASSURANCE CRITERION FOR COMPARING TWO MODE SHAPES OF A MULTI-COMPONENT STRUCTURE

(75) Inventor: Ashith Paulson Kunnel Joseph, Bangalore (IN)

(73) Assignee: AIRBUS ENGINEERING CENTRE INDIA, Bangalore, Karnataka (IN)

( * ) Notice: Subject to any disclaimer, the term of this patent is extended or adjusted under 35 U.S.C. 154(b) by 439 days.

(21) Appl. No.: 13/546,038

(22) Filed: Jul. 11, 2012

(65) Prior Publication Data

US 2013/0030771 A1 Jan. 31, 2013

(30) Foreign Application Priority Data

Jul. 29, 2011 (IN) .......................... 2600/CHE/2011

(51) Int. Cl.
G06F 17/50 (2006.01)

(52) U.S. Cl.
CPC ............ *G06F 17/50* (2013.01); *G06F 17/5095* (2013.01)

(58) Field of Classification Search
None
See application file for complete search history.

(56) References Cited

U.S. PATENT DOCUMENTS 5,195,046 A * 3/1993 Gerardi et al. .................. 702/35

OTHER PUBLICATIONS

Yi Dai, Teik Lim Suppression of brake squeal noise applying finite element brake and pad model enhanced by spectral-based assurance criteria Elsevier Ltd. 2006.*

L. Fryba, M. Pirner Load tests and modal analysis of bridges Engineering Structures 23, 2001, pp. 102-109.*

J. M. Riches, J. B. Kosmatka Damage Detection in Elastic Structures Using Vibratory Residual Forces and Weighted Sensitivity AIAA Journal vol. 30, No. 9, Sep. 1992.*

F. Massa et al; "Fuzzy modal analysis: Prediction of experimental Behaviours"; Journal of Sound and Vibration 322 (2009) 135-154; XP025973092.

Randall J. Allemang, University of Cincinnati, Cincinnati, Ohio; "The Modal Assurance Criterion—Twenty Years of Use and Abuse" see p. 16 equations 4a-4e; http://www.sandv.com/downloads/0308alle.pdf.

* cited by examiner

*Primary Examiner* — Omar Fernandez Rivas
*Assistant Examiner* — Cuong Luu
(74) *Attorney, Agent, or Firm* — Prakash Nama; Global IP Services, PLLC

(57) ABSTRACT

An improved Modal Assurance Criterion for comparing two mode shapes obtained from modal analysis of a multi-component structure is disclosed. In one embodiment, a first mode shape vector and second mode shape vector for a first mode shape and second mode shape of the multi-component structure, respectively, are formed by grouping modal displacement at each node associated with each component in the multi-component structure. Further, modal assurance criterion (MAC) between the first mode shape vector and second mode shape vector is computed by dividing a square of sum of magnitudes of correlation of the modal displacement at each component for the first mode shape vector and second mode shape vector in the multi-component structure with a product of squared magnitudes of the first mode shape vector and second mode shape vector. Furthermore, the first mode shape and second mode shape of the multi-component structure are compared using the MAC.

34 Claims, 5 Drawing Sheets

MODAL ASSURANCE CRITERION FOR COMPARING TWO MODE SHAPES OF A MULTI-COMPONENT STRUCTURE

RELATED APPLICATIONS

Benefit is claimed under 35 U.S.C. 119(a)-(d) to Foreign application Serial No. 2600/CHE/2011 filed in INDIA entitled "AN IMPROVED MODAL ASSURANCE CRITERION FOR COMPARING TWO MODE SHAPES OF A MULTI-COMPONENT STRUCTURE" by AIRBUS ENGINEERING CENTRE INDIA, filed on Jul. 29, 2011, which is herein incorporated in its entirety by reference for all purposes.

FIELD OF TECHNOLOGY

Embodiments of the present subject matter relate to comparison of mode shapes obtained from modal analysis. More particularly, embodiments of the present subject matter relate to comparison of the mode shapes obtained from the modal analysis of multi-component structures.

BACKGROUND

Typically, mode shapes of a multi-component structure are obtained by performing modal analysis on the multi-component structure. The mode shape associated with a component in the multi-component structure is a deformation shape when it is vibrating at a frequency corresponding to a free vibration mode. In the modal analysis, the mode shapes of each of the components in the multi-component structure are obtained at different frequencies corresponding to free vibration modes. The mode shapes of each of the components in the multi-component structure are then compared to identify the similarity between the mode shapes of the multi-component structure using a validation check that is referred to as general modal assurance criterion (MAC). However in such comparisons, phase conditions of the mode shapes of each of the components in the multi-component structure may not be considered for identifying the similarity.

Existing techniques to identify the similarity between the mode shapes of the multi-component structure includes either a visual identification or computing MAC. However, relative participation of each of the components in the multi-component structure is not considered during the computation of MAC. Further, the MAC for the mode shapes of the multi-component structure may be dependent on a geometric location of a node in the multi-component structure where the mode shape information is obtained. Therefore, the MAC may not give the correct information about the similarity between two mode shapes of the multi-component structure.

SUMMARY

An improved modal assurance criterion for comparing two mode shapes of a multi-component structure is disclosed. According to one aspect of the present subject matter, the method includes forming a first mode shape vector and a second mode shape vector for a first mode shape and a second mode shape of the multi-component structure, respectively, by grouping modal displacement at each node associated with each component in the multi-component structure. Further, the method includes squaring sum of magnitudes of correlation of the modal displacement at each component for the first mode shape vector and the second mode shape vector in the multi-component structure.

Furthermore, the method includes computing product of squared magnitudes of the first mode shape vector and the second mode shape vector of the multi-component structure. In addition, the method includes computing modal assurance criterion (MAC) between the first mode shape vector and the second mode shape vector of the multi-component structure by dividing the squared sum of magnitudes of the correlation of the modal displacement at each component for the first mode shape vector and the second mode shape vector in the multi-component structure with the computed product of squared magnitudes of the first mode shape vector and the second mode shape vector of the multi-component structure. Also, the method includes comparing the first mode shape and second mode shape of the multi-component structure using the computed MAC.

According to another aspect of the present subject matter, the method includes forming the first mode shape vector and the second mode shape vector for the first mode shape and the second mode shape of the multi-component structure, respectively, by grouping the modal displacement at each node associated with each component in the multi-component structure. Further, the method includes scaling the first mode shape vector and the second mode shape vector using strain energy weighting factors at each component in the multi-component structure. The strain energy weighting factor is computed by dividing strain energy at each component with total strain energy of the multi-component structure. Furthermore, the method includes squaring sum of magnitudes of correlation of the modal displacement at each component for the scaled first mode shape vector and the scaled second mode shape vector in the multi-component structure.

In addition, the method includes computing a product of squared magnitudes of the scaled first mode shape vector and the scaled second mode shape vector of the multi-component structure. Also, the method includes computing scaled modal assurance criterion (SMAC) between the scaled first mode shape vector and the scaled second mode shape vector of the multi-component structure by dividing the squared sum of magnitudes of the correlation of the modal displacement at each component for the scaled first mode shape vector and the scaled second mode shape vector in the multi-component structure with the computed product of squared magnitudes of the scaled first mode shape vector and the scaled second mode shape vector of the multi-component structure. Further, the method includes comparing the first mode shape and the second mode shape of the multi-component structure using the computed SMAC According to yet another aspect of the present subject matter, the modal analysis system for comparing the two mode shapes of the multi-component structure includes a processor and a memory coupled to the processor. Further, the memory includes a validation tool. The validation tool resides in a modal analysis tool in the modal analysis system.

The validation tool forms the first mode shape vector and the second mode shape vector for the first mode shape and the second mode shape of the multi-component structure, respectively, by grouping modal displacement at each node associated with each component in the multi-component structure. Further, the validation tool computes the square of sum of magnitudes of correlation of the modal displacement at each component for the first mode shape vector and the second mode shape vector in the multi-component structure.

Furthermore, the validation tool computes the product of squared magnitudes of the first mode shape vector and the second mode shape vector of the multi-component structure. In addition, the validation tool computes the MAC between the first mode shape vector and the second mode shape vector by dividing squared sum of magnitudes of the correlation of the modal displacement at each component for the first mode shape vector and the second mode shape vector in the multi-component structure with the computed product of squared magnitudes of the first mode shape vector and the second mode shape vector of the multi-component structure. Also, the validation tool compares the first mode shape and the second mode shape of the multi-component structure using the computed MAC.

According to one aspect of the present subject matter, the modal analysis system for comparing the two mode shapes of the multi-component structure includes a processor and a memory coupled to the processor. Further, the memory includes a validation tool. The validation tool resides in a modal analysis tool in the modal analysis system.

The validation tool forms the first mode shape vector and the second mode shape vector for the first mode shape and the second mode shape of the multi-component structure, respectively, by grouping modal displacement at each node associated with each component in the multi-component structure. Further, the validation tool scales the first mode shape vector and the second mode shape vector using strain energy weighting factors at each component in the multi-component structure. The strain energy weighting factor is computed by dividing strain energy at each component with total strain energy of the multi-component structure. Furthermore, the validation tool computes the square of sum of magnitudes of correlation of the modal displacement at each component for the scaled first mode shape vector and the scaled second mode shape vector in the multi-component structure.

In addition, the validation tool computes product of squared magnitudes of the scaled first mode shape vector and the scaled second mode shape vector of the multi-component structure. Also, the validation tool computes the SMAC between the scaled first mode shape vector and the scaled second mode shape vector of the multi-component structure by dividing squared sum of magnitudes of the correlation of the modal displacement at each component for the scaled first mode shape vector and the scaled second mode shape vector in the multi-component structure with the computed product of squared magnitudes of the scaled first mode shape vector and the scaled second mode shape vector of the multi-component structure. Further, the validation tool compares the first mode shape and the second mode shape of the multi-component structure using the computed SMAC.

The system and methods disclosed herein may be implemented in any means for achieving various aspects, and other features will be apparent from the accompanying drawings and from the detailed description that follows.

BRIEF DESCRIPTION OF THE DRAWINGS

Various embodiments are described herein with reference to the drawings, wherein.

The drawings described herein are for illustration purposes only and are not intended to limit the scope of the present invention in any way.

DETAILED DESCRIPTION

An improved modal assurance criterion for comparing two mode shapes of a multi-component structure is disclosed. In the following detailed description of the embodiments of the invention, reference is made to the accompanying drawings that form a part hereof, and in which are shown by way of illustration specific embodiments in which the invention may be practiced. These embodiments are described in sufficient detail to enable those skilled in the art to practice the invention, and it is to be understood that other embodiments may be utilized and that changes may be made without departing from the scope of the present invention. The following detailed description is, therefore, not to be taken in a limiting sense, and the scope of the present invention is defined by the appended claims.

Figure 1:
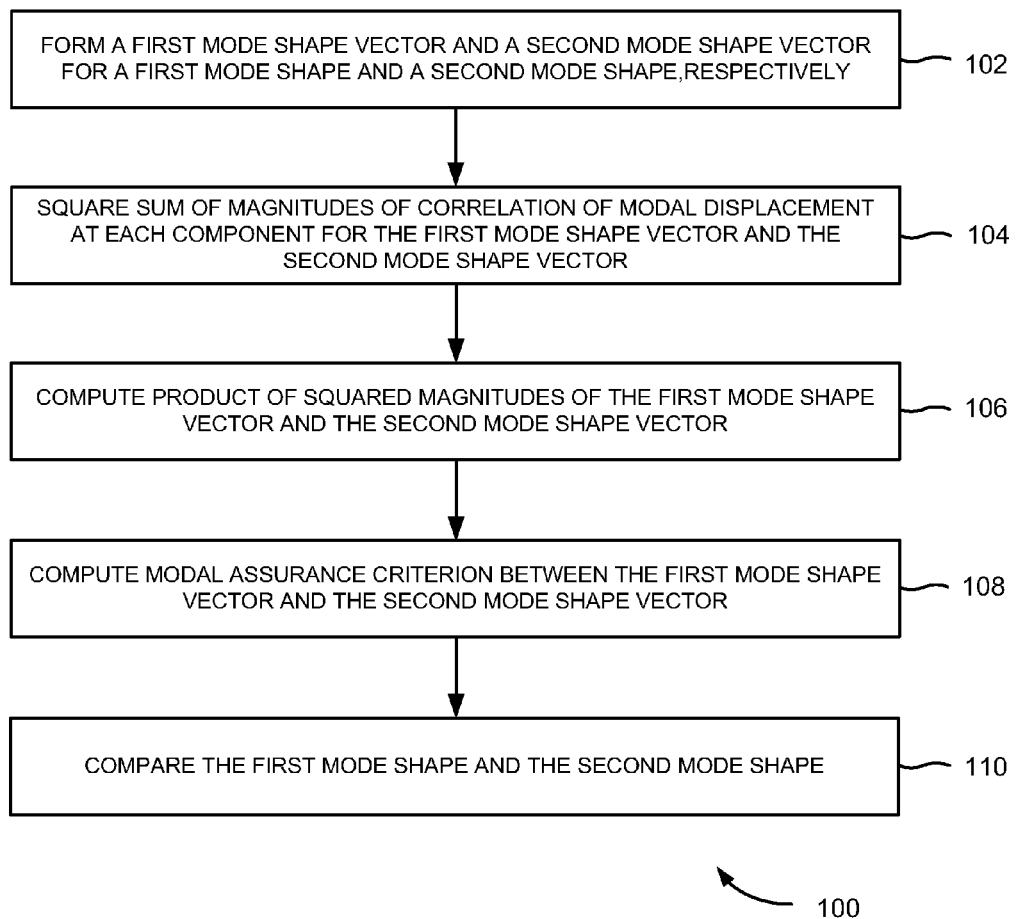
FIG. 1 is a flow diagram illustrating an exemplary method of comparing two mode shapes of a multi-component structure, according to an embodiment of the invention.

Referring now to FIG. 1, which illustrates a flow diagram 100 of an exemplary method of comparing two mode shapes of a multi-component structure, according to an embodiment of the invention. At block 102, a first mode shape vector and a second mode shape vector for a first mode shape and a second mode shape of the multi-component structure, respectively, are formed by grouping modal displacement at each node associated with each component in the multi-component structure. The first mode shape vector and the second mode shape vector for the first mode shape and the second mode shape of the multi-component structure, respectively, are formed using equations:

$$\Psi_r = \begin{Bmatrix} \Psi_{r,comp-1} \\ \Psi_{r,comp-2} \\ \vdots \\ \Psi_{r,comp-n} \end{Bmatrix} \text{ and } \Psi_s = \begin{Bmatrix} \Psi_{s,comp-1} \\ \Psi_{s,comp-2} \\ \vdots \\ \Psi_{s,comp-n} \end{Bmatrix}$$

wherein, $\psi_r$ is the first mode shape vector of the multi-component structure, $\psi_s$ is the second mode shape vector of the multi-component structure, $\psi_{r,comp-n}$ is the first mode shape vector of a component n, $\psi_{s,comp-n}$ is the second mode shape vector of the component n, and n is the number of components in the multi-component structure.

At block 104, a square of sum of magnitudes of correlation of the modal displacement at each component for the first mode shape vector and the second mode shape vector in the multi-component structure is computed. The square of the sum of magnitudes of the correlation of the modal displacement at each component for the first mode shape vector and the second mode shape vector in the multi-component structure is computed using an equation:

$$||\psi_{r,comp-1}{}^H\psi_{s,comp-1}| + |\psi_{r,comp-2}{}^H\psi_{s,comp-2}| + \ldots + |\psi_{r,comp-n}{}^H\psi_{s,comp-n}||^2$$

wherein, $\psi_{r,comp-n}{}^H$ is hermitian transpose of $\psi_{r,comp-n}$.

At block 106, a product of squared magnitudes of the first mode shape vector and the second mode shape vector of the multi-component structure is computed. The product of squared magnitudes of the first mode shape vector and the second mode shape vector of the multi-component structure is computed using an equation:

$$(\psi_r{}^H\psi_r)(\psi_s{}^H\psi_s)$$

wherein, $\psi_r^H$, is hermitian transpose of $\psi_r$ and $\psi_s^H$ is hermitian transpose of $\psi_s$.

At block 108, modal assurance criterion (MAC) between the first mode shape vector and the second mode shape vector of the multi-component structure is computed by dividing the squared sum of magnitudes of the correlation of the modal displacement at each component for the first mode shape vector and the second mode shape vector in the multi-component structure with the computed product of squared magnitudes of the first mode shape vector and the second mode shape vector of the multi-component structure. The MAC between the first mode shape vector and the second mode shape vector of the multi-component structure is computed using an equation:

$$MAC(\Psi_r, \Psi_s) = \frac{||\Psi_{r,comp-1}^H \Psi_{s,comp-1}| + |\Psi_{r,comp-2}^H \Psi_{s,comp-2}| + \ldots + |\Psi_{r,comp-n}^H \Psi_{s,comp-n}||^2}{(\Psi_r^H \Psi_r)(\Psi_s^H \Psi_s)}$$

wherein, $||\psi_{r,comp-1}^H \psi_{s,comp-1}| + |\psi_{r,comp-2}^H \psi_{s,comp-2}| + \ldots + |\psi_{r,comp-n}^H \psi_{s,comp-n}||^2$ is the square of sum of the magnitudes of the correlation of the modal displacement at each component for the first mode shape vector and the second mode shape vector in the multi-component structure and $(\psi_r^H \psi_r)(\psi_s^H \psi_s)$ is the product of squared magnitudes of the first mode shape vector and the second mode shape vector of the multi-component structure.

At block 110, the first mode shape and second mode shape of the multi-component structure are compared using the computed MAC. In another embodiment, the first mode shape and the second mode shape of the multi-component structure are compared using scaled modal assurance criterion (SMAC). This is explained in more detail with reference to FIG. 2.

Figure 2:
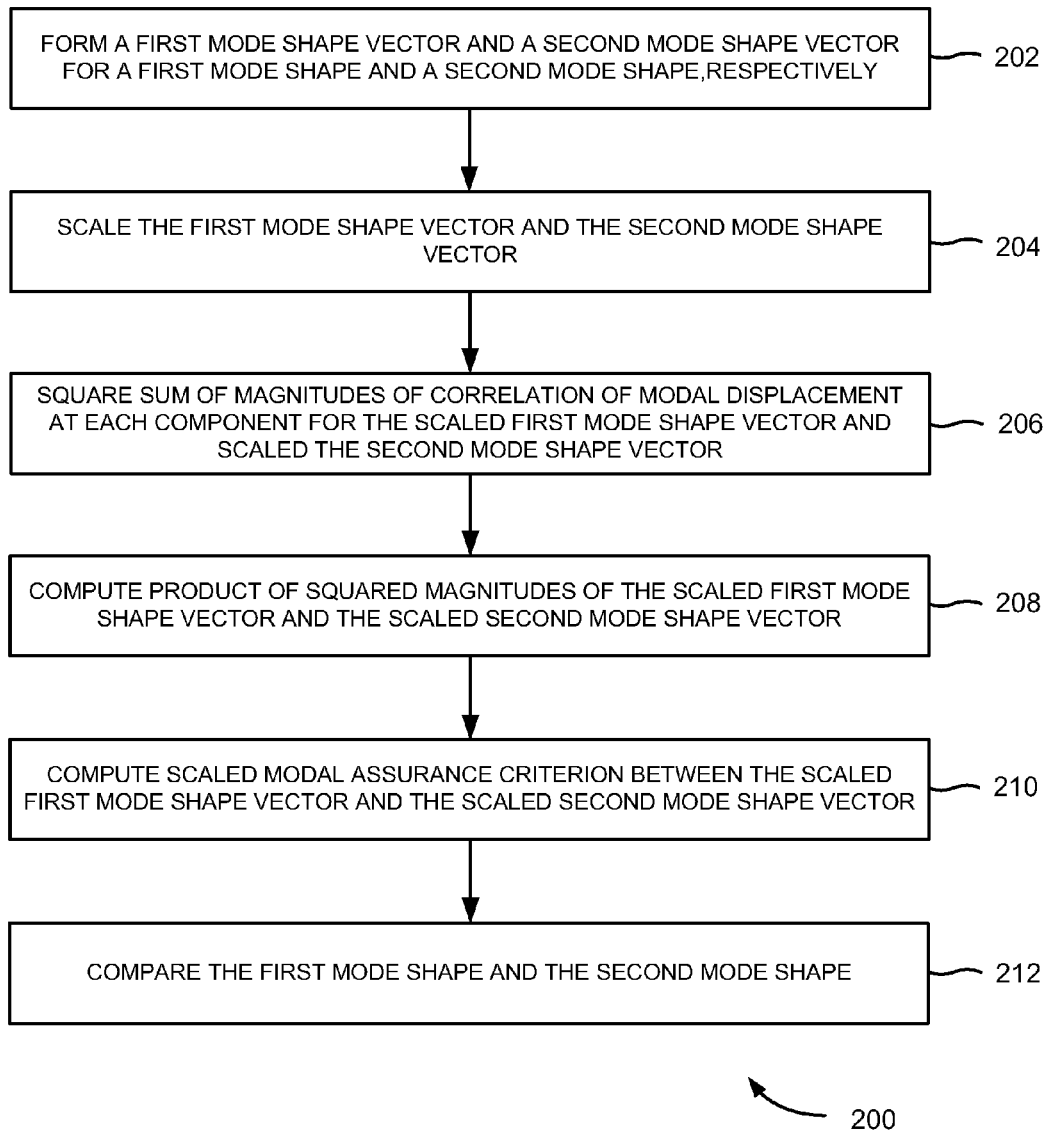
FIG. 2 is another flow diagram illustrating an exemplary method of comparing the two mode shapes of the multi-component structure, according to an embodiment of the invention.

Referring now to FIG. 2, which illustrates another flow diagram 200 of an exemplary method of comparing two mode shapes of a multi-component structure, according to an embodiment of the invention. At block 202, a first mode shape vector and a second mode shape vector for a first mode shape and a second mode shape of the multi-component structure, respectively, are formed by grouping modal displacement at each node associated with each component in the multi-component structure. The first mode shape vector and the second mode shape vector for the first mode shape and the second mode shape of the multi-component structure, respectively, are formed using equations:

$$\Psi_r = \begin{Bmatrix} \Psi_{r,comp-1} \\ \Psi_{r,comp-2} \\ \vdots \\ \Psi_{r,comp-n} \end{Bmatrix} \text{ and } \Psi_s = \begin{Bmatrix} \Psi_{s,comp-1} \\ \Psi_{s,comp-2} \\ \vdots \\ \Psi_{s,comp-n} \end{Bmatrix}$$

wherein, $\psi_r$ is the first mode shape vector of the multi-component structure, $\psi_s$ is the second mode shape vector of the multi-component structure, $\psi_{r,comp-n}$ is the first mode shape vector of a component n, $\psi_{s,comp-n}$ is the second mode shape vector of the component n, and n is the number of components in the multi-component structure.

At block 204, the first mode shape vector and the second mode shape vector are scaled using strain energy weighting factors at each component in the multi-component structure. The strain energy weighting factor is computed by dividing strain energy at each component with total strain energy of the multi-component structure. The first mode shape vector and the second mode shape vector of each of the components in the multi-component structure are scaled using equations:

$$\psi_{r',comp-n} = SE_{comp-n} \psi_{r,comp-n} \text{ and } \psi_{s',comp-n} = SE_{comp-n} \psi_{s,comp-n}$$

wherein, $SE_{comp-n}$ is the strain energy weighting factor of component n, $\psi_{r',comp-n}$ is the scaled first mode shape vector of the component n, $\psi_{s',comp-n}$ is the scaled second mode shape vector of the component n, and n is the number of components in the multi-component structure.

The scaled first mode shape vector and scaled second mode shape vector for the first mode shape and the second mode shape of the multi-component structure, respectively, are formed using equations:

$$\Psi_{r'} = \begin{Bmatrix} \Psi_{r',comp-1} \\ \Psi_{r',comp-2} \\ \vdots \\ \Psi_{r',comp-n} \end{Bmatrix} \text{ and } \Psi_{s'} = \begin{Bmatrix} \Psi_{s',comp-1} \\ \Psi_{s',comp-2} \\ \vdots \\ \Psi_{s',comp-n} \end{Bmatrix}$$

wherein, $\psi_{r'}$ is the scaled first mode shape vector of the multi-component structure, $\psi_{s'}$ is the scaled second mode shape vector of the multi-component structure, $\psi_{r',comp-n}$ is the scaled first mode shape vector of the component n, $\psi_{r',comp-n}$ is the scaled second mode shape vector of the component n, and n is the number of components in the multi-component structure.

At block 206, a square of sum of magnitudes of correlation of the modal displacement at each component for the scaled first mode shape vector and the scaled second mode shape vector in the multi-component structure is computed. The square of the sum of magnitudes of the correlation of the modal displacement at each component for the scaled first mode shape vector and the scaled second mode shape vector in the multi-component structure is computed using an equation:

$$||\psi_{r',comp-1}^H \psi_{s',comp-1}| + |\psi_{r',comp-2}^H \psi_{s',comp-2}| + \ldots + |\psi_{r',comp-n}^H \psi_{s',comp-n}||^2$$

wherein, $\psi_{r',comp-1}^H$ is hermitian transpose of $\psi_{r',comp-n}$.

At block 208, a product of squared magnitudes of the scaled first mode shape vector and the scaled second mode shape vector of the multi-component structure is computed. The product of squared magnitudes of the scaled first mode shape vector and the scaled second mode shape vector of the multi-component structure is computed using an equation:

$$(\psi_{r'}^H \psi_{r'})(\psi_{s'}^H \psi_{s'})$$

wherein, $\psi_{r'}^H$ is hermitian transpose of $\psi_{r'}$ and $\psi_{s'}^H$ is hermitian transpose of $\psi_{s'}$.

At block 210, SMAC between the scaled first mode shape vector and the scaled second mode shape vector of the multi-component structure is computed by dividing the squared sum of magnitudes of the correlation of the modal displacement at each component for the scaled first mode shape vector and the scaled second mode shape vector in the multi-component structure with the computed product of squared magnitudes of the scaled first mode shape vector and the scaled second mode shape vector of the multi-component structure. The SMAC between the scaled first mode shape vector and the scaled second mode shape vector of the multi-component structure is computed using an equation:

$$SCMAC(\Psi_{r'}, \Psi_{s'}) = \frac{\left(|\Psi_{r',comp-1}^H \Psi_{s',comp-1}| + |\Psi_{r',comp-2}^H \Psi_{s',comp-2}| + \ldots + |\Psi_{r',comp-n}^H \Psi_{s',comp-n}|\right)^2}{((\Psi_{r'}^H \Psi_{r'})(\Psi_{s'}^H \Psi_{s'}))}$$

wherein, $||\psi_{r',comp-1}^H \psi_{s',comp-1}| + |\psi_{r',comp-2}^H \psi_{s',comp-2}| + \ldots + |\psi_{r',comp-n}^H \psi_{s',comp-n}||^2$ is the square of sum of the magnitudes of the correlation of the modal displacement at each component for the scaled first mode shape vector and the scaled second mode shape vector in the multi-component structure and $(\psi_{r'}^H \psi_{r'})(\psi_{s'}^H \psi_{s'})$ is the product of squared magnitudes of the scaled first mode shape vector and the scaled second mode shape vector of the multi-component structure. At block 212, the first mode shape and the second mode shape of the multi-component structure are compared using the computed SMAC.

Figure 3A:
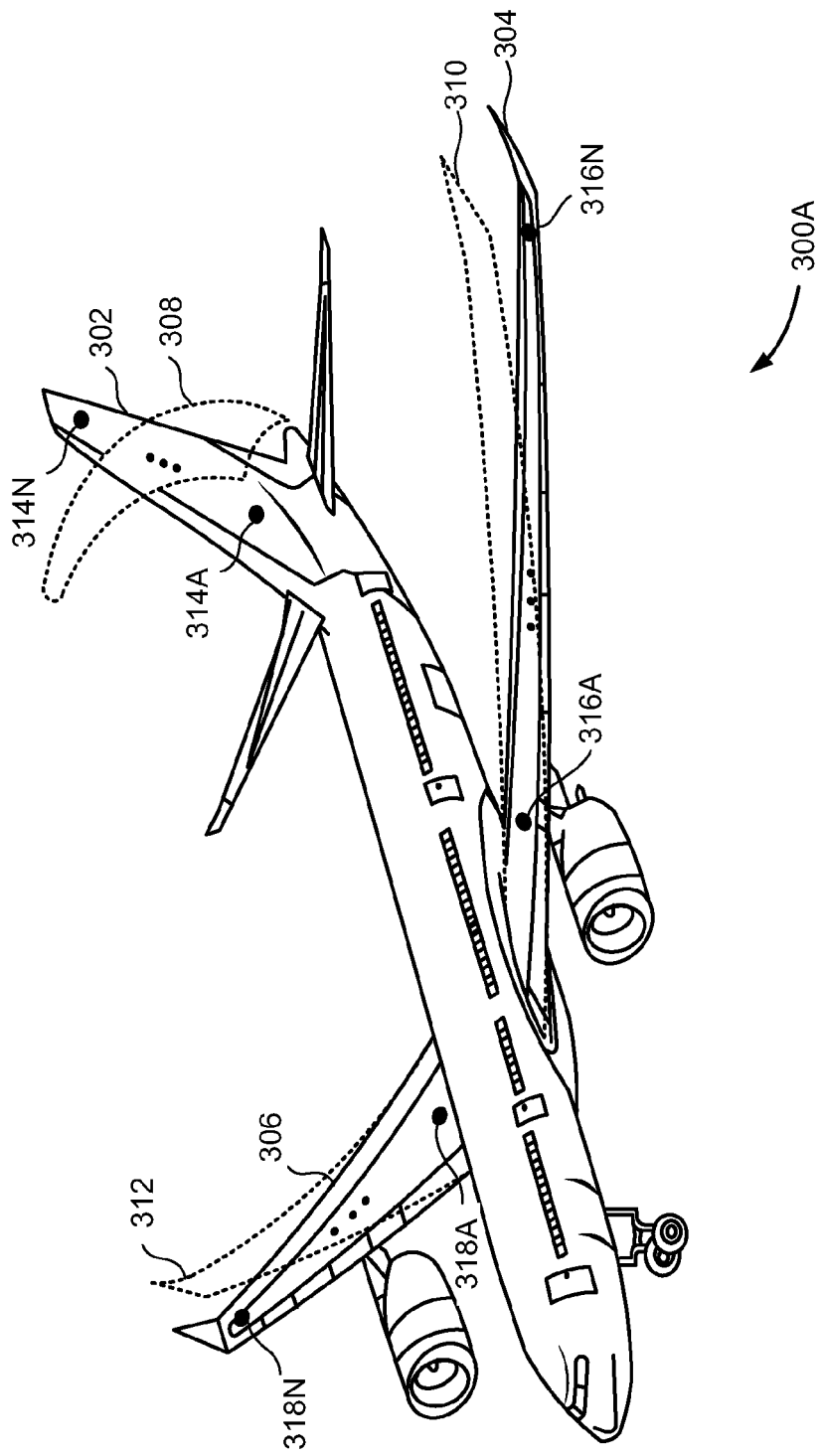
FIGS. 3A-B illustrate mode shapes of a plurality of components of an aircraft at two different frequency modes, respectively, used in the processes shown in the FIGS. 1 and 2, according to an embodiment of the invention.

Referring now to FIG. 3A, which illustrates mode shapes, i.e., 308, 310, and 312, of a plurality of components, i.e., vertical tail plane (VTP) 302, wing 304, and wing 306, respectively, of an aircraft 300A at a frequency mode, used in the processes shown in FIGS. 1 and 2, according to an embodiment of the invention. During modal analysis of the plurality of components, i.e., VTP 302, wing 304 and wing 306, deformation information of each of the plurality of components, i.e., VTP 302, wings 304 and 306, is available at a plurality of modal displacement nodes, i.e., 314 A-N, 316A-N, and 318A-N, respectively. The modal displacement nodes, i.e., 314 A-N, 316A-N, and 318A-N, are geometric locations in the plurality of components, i.e., VTP 302, wings 304 and 306, respectively, where deformation information is available. Further, each of the mode shapes, i.e., 308, 310, and 312, is obtained by grouping the deformation information available at the plurality of modal displacement nodes, i.e., 314 A-N, 316A-N, and 318A-N, respectively. In one exemplary implementation, the wing 304 and wing 306 can include two modal displacement nodes, i.e., 316A-B and 318A-B, respectively, and the VTP 302 can include ten modal displacement nodes, i.e., 314A-J. Further, the mode shape 308 is obtained by grouping the deformation information at the plurality of modal displacement nodes, i.e., 314A-J, in the VTP 302. Furthermore, the mode shapes, i.e., 310 and 312, are obtained by grouping the deformation information available at the plurality of modal displacement nodes, i.e., 316A-J and 318A-J, respectively, in the wing 304 and wing 306. In addition, the mode shapes, i.e., 308, 310, and 312 are scaled by strain energy fractions of the plurality of components, i.e., VTP 302, wing 304, and wing 306, respectively. The mode shapes of the plurality of components, i.e., VTP 302, wing 304, and wing 306, at another frequency mode is explained in more detail with reference to FIG. 3B.

Figure 3B:
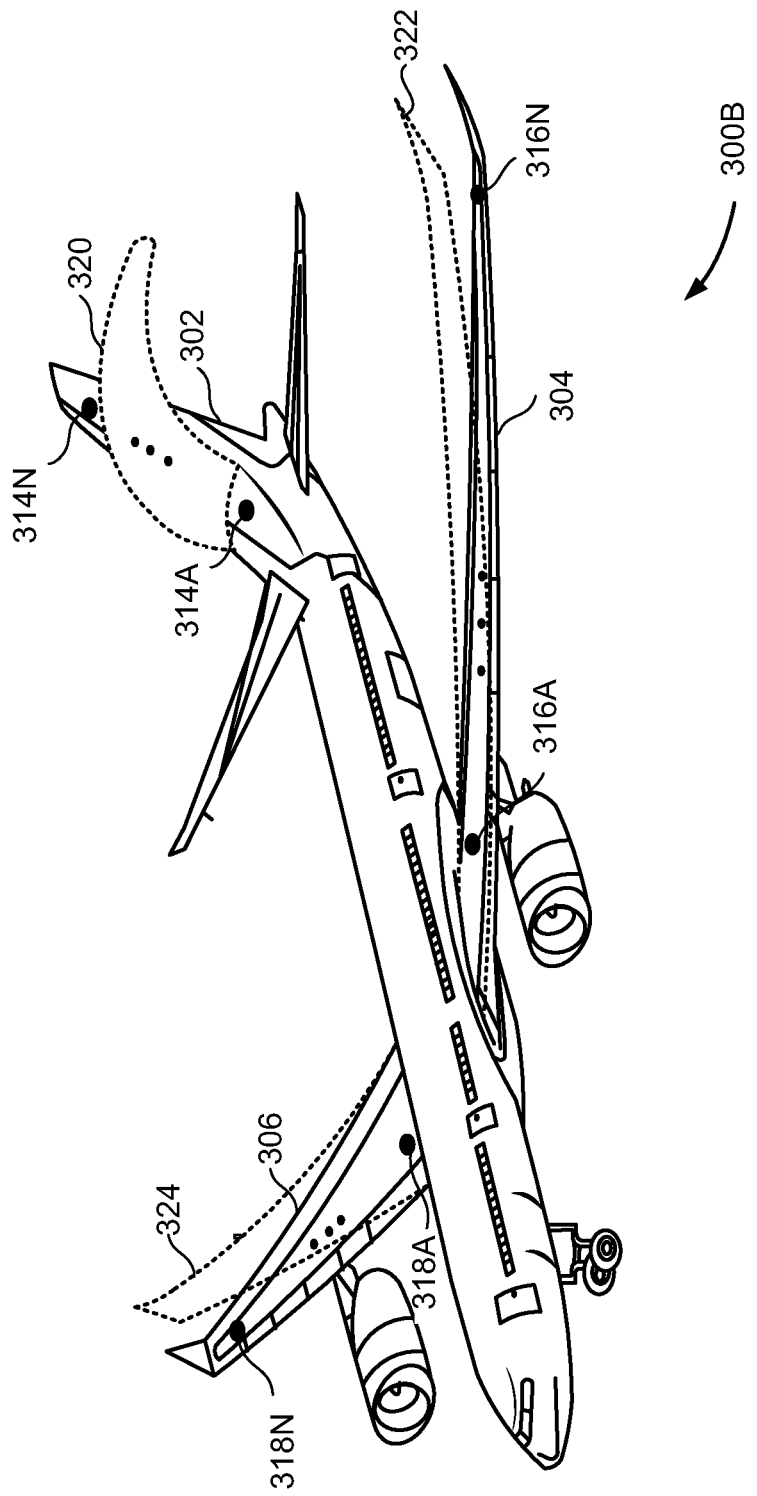

Referring now to FIG. 3B, illustrates mode shapes, i.e., 320, 322, and 324, of the plurality of components, i.e., VTP 302, wings 304 and 306, of an aircraft 300B at another frequency mode, used in the processes shown in the FIGS. 1 and 2, according to an embodiment of the invention. Further, the mode shapes, i.e., 320, 322, and 324, are obtained by grouping the deformation information available at the plurality of modal displacement nodes, i.e., 314A-N, 316A-N, and 318A-N, respectively. Furthermore, this is explained in more detail with reference to FIG. 3A. In addition, the mode shape 308 of the component VTP 302, such as the one shown in FIG. 3A, is out of phase with the mode shape 320 of the component VTP 302, such as the one shown in FIG. 3B.

Figure 4:
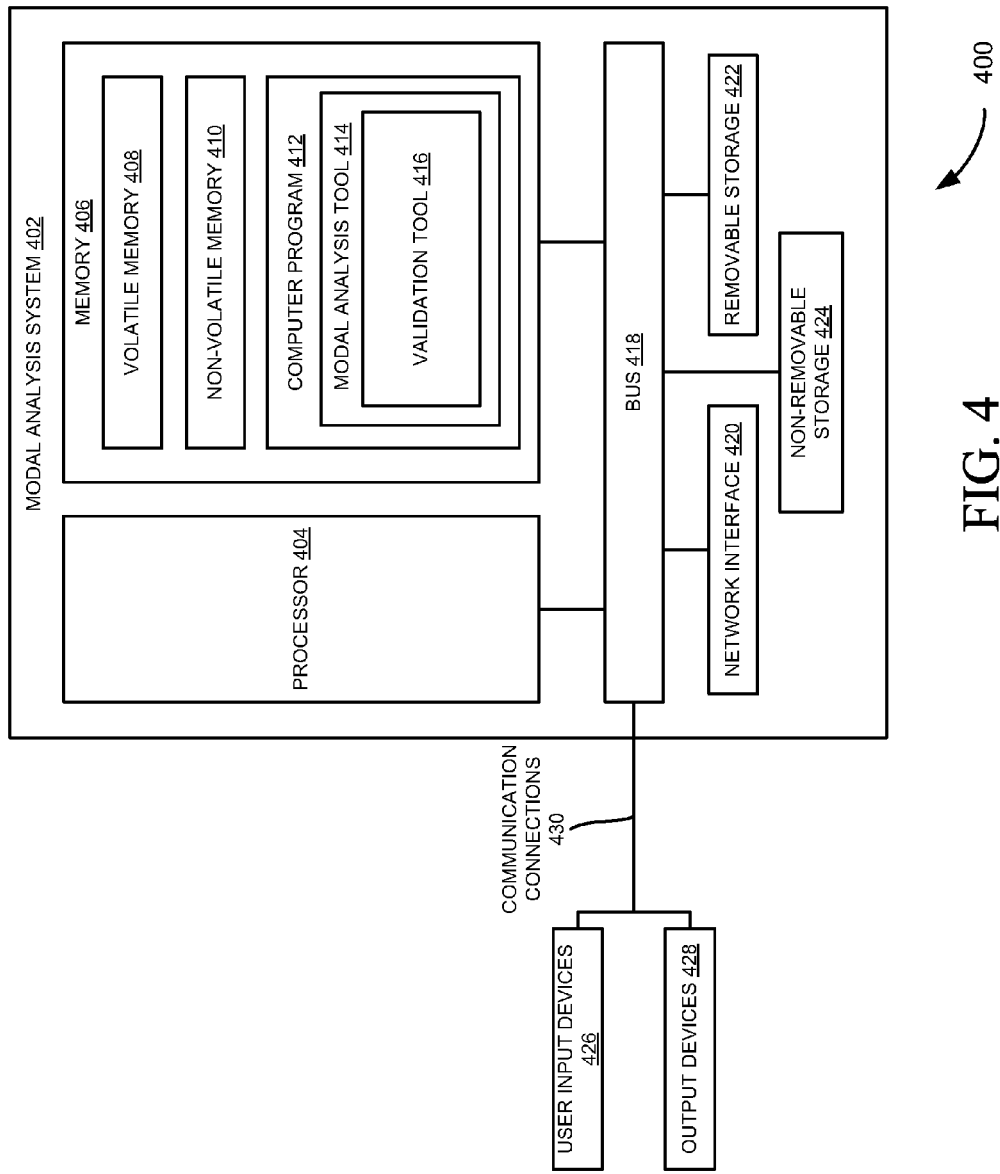
FIG. 4 illustrates a modal analysis system including a validation tool for comparing the two mode shapes of the multi-component structure using the processes shown in FIGS. 1 and 2, according to an embodiment of the invention.

Referring now to FIG. 4, which illustrates a modal analysis system 402 including a validation tool 416 to compare two mode shapes of the multi-component structure using the processes shown in FIGS. 1 and 2, according to an embodiment of the invention. FIG. 4 and the following discussions are intended to provide a brief, general description of a suitable computing environment in which certain embodiments of the inventive concepts contained herein are implemented.

The modal analysis system 402 includes a processor 404, memory 406, a removable storage 422, and a non-removable storage 424. The modal analysis system 402 additionally includes a bus 418 and a network interface 420. As shown in FIG. 4, the modal analysis system 402 includes access to the computing system environment 400 that includes one or more user input devices 426, one or more output devices 428, and one or more communication connections 430 such as a network interface card and/or a universal serial bus connection.

Exemplary user input devices 426 include a digitizer screen, a stylus, a trackball, a keyboard, a keypad, a mouse and the like. Exemplary output devices 428 include a display unit of the personal computer, a mobile device, the FMS, and the like. Exemplary communication connections 430 include a local area network, a wide area network, and/or other network.

The memory 406 further includes volatile memory 408 and non-volatile memory 410. A variety of computer-readable storage media are stored in and accessed from the memory elements of the modal analysis system 402, such as the volatile memory 408 and the non-volatile memory 410, the removable storage 422 and the non-removable storage 424. The memory elements include any suitable memory device(s) for storing data and machine-readable instructions, such as read only memory, random access memory, erasable programmable read only memory, electrically erasable programmable read only memory, hard drive, removable media drive for handling compact disks, digital video disks, diskettes, magnetic tape cartridges, memory cards, Memory Sticks™, and the like.

The processor 404, as used herein, means any type of computational circuit, such as, but not limited to, a microprocessor, a microcontroller, a complex instruction set computing microprocessor, a reduced instruction set computing microprocessor, a very long instruction word microprocessor, an explicitly parallel instruction computing microprocessor, a graphics processor, a digital signal processor, or any other type of processing circuit. The processor 404 also includes embedded controllers, such as generic or programmable logic devices or arrays, application specific integrated circuits, single-chip computers, smart cards, and the like.

Embodiments of the present subject matter may be implemented in conjunction with program modules, including functions, procedures, data structures, and application programs, for performing tasks, or defining abstract data types or low-level hardware contexts. Machine-readable instructions stored on any of the above-mentioned storage media may be executable by the processor 404 of the modal analysis system 402. For example, a computer program 412 includes machine-readable instructions capable of comparing two mode shapes of the multi-component structure in the modal analysis system 402, according to the teachings and herein described embodiments of the present subject matter. In one embodiment, the computer program 412 is included on a compact disk-read only memory (CD-ROM) and loaded from the CD-ROM to a hard drive in the non-volatile memory 410. The machine-readable instructions cause the modal analysis system 402 to encode according to the various embodiments of the present subject matter.

As shown, the computer program 412 includes a modal analysis tool 414. Further, modal analysis tool 414 includes the validation tool 416. For example, the validation tool 416 can be in the form of instructions stored on a non-transitory computer-readable storage medium. The non-transitory computer-readable storage medium having the instructions that, when executed by the modal analysis system 402, causes the modal analysis system 402 to perform the one or more methods described in FIGS. 1 and 2.

In various embodiments, system and methods described in FIGS. 1 through 4 propose the improved MAC for comparing two mode shapes of the multi-component structure. The improved MAC uses a concept of partial correlations between the mode shapes of the plurality of components. Hence, the phase difference between the mode shapes of the plurality of components is considered during the MAC. In some embodiments, the mode shapes of the plurality of components are scaled by the strain energy fractions of the plurality of components, respectively. Hence, error in the MAC results due to the geometric location of the plurality of modal displacement nodes is reduced.

Although the present embodiments have been described with reference to specific example embodiments, it will be evident that various modifications and changes may be made to these embodiments without departing from the broader scope of the various embodiments. Furthermore, the various devices, modules, analyzers, generators, and the like described herein may be enabled and operated using hardware circuitry, for example, complementary metal oxide semiconductor based logic circuitry, firmware, software and/or any combination of hardware, firmware, and/or software embodied in a machine readable medium. For example, the various electrical structures and methods may be embodied using transistors, logic gates, and electrical circuits, such as an application specific integrated circuit.

What is claimed is:

1. A method for comparing two mode shapes of a multi-component structure, comprising:
   forming, by a validation tool residing in memory, a first mode shape vector and a second mode shape vector for a first mode shape and a second mode shape of the multi-component structure, respectively, by grouping modal displacement at each node associated with each component in the multi-component structure;
   squaring sum of magnitudes of correlation of the modal displacement at each component for the first mode shape vector and the second mode shape vector in the multi-component structure by the validation tool;
   computing a product of squared magnitudes of the first mode shape vector and the second mode shape vector of the multi-component structure by the validation tool;
   computing by the validation tool, modal assurance criterion between the first mode shape vector and the second mode shape vector of the multi-component structure by dividing the squared sum of magnitudes of the correlation of the modal displacement at each component for the first mode shape vector and the second mode shape vector in the multi-component structure with the computed product of squared magnitudes of the first mode shape vector and the second mode shape vector of the multi-component structure; and
   comparing, by the validation tool, the first mode shape and second mode shape of the multi-component structure using the computed modal assurance criterion to identify similarity between the two mode shapes of the multi-component structure.

2. The method of claim 1, wherein the first mode shape vector and the second mode shape vector for the first mode shape and the second mode shape of the multi-component structure, respectively, are formed using equations:

$$\Psi_r = \begin{Bmatrix} \Psi_{r,comp-1} \\ \Psi_{r,comp-2} \\ \vdots \\ \Psi_{r,comp-n} \end{Bmatrix} \text{ and } \Psi_s = \begin{Bmatrix} \Psi_{s,comp-1} \\ \Psi_{s,comp-2} \\ \vdots \\ \Psi_{s,comp-n} \end{Bmatrix}$$

wherein, $\psi_r$ is the first mode shape vector of the multi-component structure, $\psi_s$ is the second mode shape vector of the multi-component structure, $\psi_{r,comp-n}$ is the first mode shape vector of a component n, $\psi_{s,comp-n}$ is the second mode shape vector of the component n, and n is the number of components in the multi-component structure.

3. The method of claim 1, wherein the square of the sum of magnitudes of the correlation of the modal displacement at each component for the first mode shape vector and the second mode shape vector in the multi-component structure is computed using an equation:

$$\|\psi_{r,comp-1}^H \psi_{s,comp-1}| + |\psi_{r,comp-2}^H \psi_{s,comp-2}| + \ldots + |\psi_{r,comp-n}^H \psi_{s,comp-n}\|^2$$

wherein, $\psi_r^H$,comp-n is hermitian transpose of $\psi_{r,comp-n}$.

4. The method of claim 1, wherein the product of squared magnitudes of the first mode shape vector and the second mode shape vector of the multi-component structure is computed using an equation:

$$(\psi_r^H \psi_r)(\psi_s^H \psi_s)$$

wherein, $\psi_r^H$, is hermitian transpose of $\psi_r$ and $\psi_s^H$ is hermitian transpose of $\psi_s$.

5. The method of claim 1, wherein the modal assurance criterion between the first mode shape vector and the second mode shape vector of the multi-component structure is computed using an equation:

$$MAC(\Psi_r, \Psi_s) = \frac{\||\Psi_{r,comp-1}^H \Psi_{s,comp-1}| + |\Psi_{r,comp-2}^H \Psi_{s,comp-2}| + \ldots + |\Psi_{r,comp-n}^H \Psi_{s,comp-n}\|^2}{(\Psi_r^H \Psi_r)(\Psi_s^H \Psi_s)}$$

wherein, $\|\psi_{r,comp-1}^H \psi_{s,comp-1}| + |\psi_{r,comp-2}^H \psi_{s,comp-2}| + \ldots + |\psi_{r,comp-n}^H \psi_{s,comp-n}\|^2$ is the square of sum of the magnitudes of the correlation of the modal displacement at each component for the first mode shape vector and the second mode shape vector in the multi-component structure and $(\psi_r^H \psi_r)(\psi_s^H \psi_s)$ is the product of squared magnitudes of the first mode shape vector and the second mode shape vector of the multi-component structure.

6. The method of claim I further comprising:
scaling the first mode shape vector and the second mode shape vector using strain energy weighting factors at each component in the multi-component structure.

7. The method of claim 6, wherein the strain energy weighting factor is computed by dividing strain energy at each component with total strain energy of the multi-component structure.

8. The method of claim 6, wherein the first mode shape vector and the second mode shape vector at each component in the multi-component structure are scaled using equations:

$$\psi_{r',comp-n} = SE_{comp-n} \psi_{r,comp-n} \text{ and } \psi_{s',comp-n} = SE_{comp-n} \psi_{s,comp-n}$$

wherein, $SE_{comp-n}$ is the strain energy weighting factor of component n, $\psi_{r',comp-n}$ is the scaled first mode shape vector of the component $\psi_{s',comp-n}$ is the scaled second mode shape vector of the component n, and n is the number of components in the multi-component structure.

9. The method of claim 8, wherein the scaled first mode shape vector and scaled second mode shape vector for the first mode shape and the second mode shape of the multi-component structure, respectively, are formed using equations:

$$\Psi_{r'} = \begin{Bmatrix} \psi_{r',comp-1} \\ \psi_{r',comp-2} \\ \vdots \\ \psi_{r',comp-n} \end{Bmatrix} \text{ and } \Psi_{s'} = \begin{Bmatrix} \psi_{s',comp-1} \\ \psi_{s',comp-2} \\ \vdots \\ \psi_{s',comp-n} \end{Bmatrix}$$

wherein, $\psi_{r'}$ is the scaled first mode shape vector of the multi-component structure, $\psi_{s'}$ is the scaled second mode shape vector of the multi-component structure, $\psi_{r',comp-n}$ is the scaled first mode shape vector of the component a, $\psi_{r',comp-n}$ is the scaled second mode shape vector of the component n, and a is the number of components in the multi-component structure.

10. The method of claim 9, further comprising:
squaring sum of magnitudes of correlation of the modal displacement at each component for the scaled first mode shape vector and the scaled second mode shape vector in the multi-component structure.

11. The method of claim 10, wherein the square of the sum of magnitudes of the correlation of the modal displacement at each component for the scaled first mode shape vector and the scaled second mode shape vector in the multi-component structure is computed using an equation:

$$\|\psi_{r',comp-1}^H \psi_{s',comp-1}| + |\psi_{r',comp-2}^H \psi_{s',comp-2}| + \ldots + |\psi_{r',comp-n}^H \psi_{s',comp-n}\|^2$$

wherein, $\psi_{r',comp-1}^H$ is hermitian transpose of $\psi_{r',comp-n}$.

12. The method of claim 10, further comprising:
computing a product: of squared magnitudes of the scaled first mode shape vector and the scaled second mode shape vector of the multi-component structure.

13. The method of claim 12, wherein the product of squared magnitudes of the scaled first mode shape vector and the scaled second mode shape vector of the multi-component structure is computed using an equation:

$$(\psi_{r'}^H \psi_{r'})(\psi_{s'}^H \psi_{s'})$$

wherein, $\psi_{r'}^H$ is hermitian transpose of $\psi_{r'}$ and $\psi_{s'}^H$ is hermitian transpose of $\psi_{s'}$.

14. The method of claim 12, further comprising:
computing scaled modal assurance criterion between the scaled first mode shape vector and the scaled second mode shape vector of the multi-component structure by dividing the squared sum of magnitudes of the correlation of the modal displacement at each component for the scaled first mode shape vector and the scaled second mode shape vector in the multi-component structure with the computed product of squared magnitudes of the scaled first mode shape vector and the scaled second mode shape vector of the multi-component structure.

15. The method of claim 14, wherein the scaled modal assurance criterion between the scaled first mode shape vector and the scaled second mode shape vector of the multi-component structure is computed using an equation:

$$SCMAC(\Psi_{r'}, \Psi_{s'}) = \frac{\||\Psi_{r',comp-1}^H \Psi_{s',comp-1}| + |\Psi_{r',comp-2}^H \Psi_{s',comp-2}| + \ldots + |\Psi_{r',comp-n}^H \Psi_{s',comp-n}|\|^2}{((\Psi_{r'}^H \Psi_{r'})(\Psi_{s'}^H \Psi_{s'}))}$$

wherein, $\|\psi_{r',comp-1}^H \psi_{s',comp-1}| + |\psi_{r',comp-2}^H \psi_{s',comp-2}| + \ldots + |\psi_{r',comp-n}^H \psi_{s',comp-n}\|^2$ is the square of sum of the magnitudes of the correlation of the modal displacement at each component for the scaled first mode shape vector and the scaled second mode shape vector in the multi-component structure and $(\psi_{r'}^H \psi_{r'})(\psi_{s'}^H \psi_{s'})$ is the product of squared magnitudes of the sealed first mode shape vector and the scaled second mode shape vector of the multi-component structure.

16. A modal analysis system to compare two mode shapes of a multi-component structure, comprising:
a processor; and
memory coupled to the processor, wherein the memory includes a validation tool to:
form a first mode shape vector and a second mode shape vector for a first mode shape and a second mode shape of the multi-component structure, respectively, by grouping modal displacement at each node associated with each component m the multi-component structure;
compute a square of sum of magnitudes of correlation of the modal displacement at each component for the first mode shape vector and the second mode shape vector in the multi-component structure;
compute a product of squared magnitudes of the first mode shape vector and the second mode shape vector of the multi-component structure:
compute modal assurance criterion between the first mode shape vector and the second mode shape vector of the multi-component structure by dividing squared sum of magnitudes of the correlation of the modal displacement at each component for the first mode shape vector and the second mode shape vector in the multi-component structure with the computed product of squared magnitudes of the first mode shape vector and the second mode shape vector of the multi-component structure; and
compare the first mode shape and the second mode shape of the multi-component structure using the computed modal assurance criterion to identify similarity between the two mode shapes of the multi-component structure.

17. The modal analysis system of claim 16, wherein the validation tool is residing in a modal analysis tool in the modal analysis system.

18. The modal analysis system of claim 16, wherein the validation tool forms the first mode shape vector and the second mode shape vector for the first mode shape and the second mode shape of the multi-component structure, respectively, using equations:

$$\Psi_r = \begin{Bmatrix} \Psi_{r,comp-1} \\ \Psi_{r,comp-2} \\ \vdots \\ \Psi_{r,comp-n} \end{Bmatrix} \text{ and } \Psi_s = \begin{Bmatrix} \Psi_{s,comp-1} \\ \Psi_{s,comp-2} \\ \vdots \\ \Psi_{s,comp-n} \end{Bmatrix}$$

wherein, $\psi_r$ is the first mode shape vector of the multi-component structure, $\psi_s$ is the second mode shape vector of the multi-component structure, $\psi_{r,comp-n}$ is the first mode shape vector of a component n, $\psi_{s,comp-n}$ is the second mode shape vector of the component n, and n is the number of components in the multi-component structure.

19. The modal analysis system of claim 16, wherein the validation tool computes the square of the sum of magnitudes of the correlation of the modal displacement at each component for the first mode shape vector and the second mode shape vector in the multi-component structure using an equation:

$$\|\psi_{r,comp-1}^H \psi_{s,comp-1}| + |\psi_{r,comp-2}^H \psi_{s,comp-2}| + \ldots + |\psi_{r,comp-n}^H \psi_{s,comp-n}\|^2$$

wherein, $\psi_{r,comp-n}^H$ is hermitian transpose of $\psi_{r,comp-n}$.

20. The modal analysis system of claim 16, wherein the validation tool computes the product of squared magnitudes of the first mode shape vector and the second mode shape vector of the multi-component structure using an equation:

$$(\psi_r^H \psi_r)(\psi_s^H \psi_s)$$

wherein, $\psi_r^H$, is hermitian transpose of $\psi_r$ and $\psi_s^H$ is hermitian transpose of $\psi_s$.

21. The modal analysis system of claim 16, wherein the validation tool computes the modal assurance criterion between the first mode shape vector and the second mode shape vector of the multi-component structure using an equation:

$$MAC(\Psi_r, \Psi_s) = \frac{\||\Psi_{r,comp-1}^H \Psi_{s,comp-1}| + |\Psi_{r,comp-2}^H \Psi_{s,comp-2}| + \ldots + |\Psi_{r,comp-n}^H \Psi_{s,comp-n}\|^2}{(\Psi_r^H \Psi_r)(\Psi_s^H \Psi_s)}$$

wherein, $\||\psi_{r,comp-1}^H \psi_{s,comp-1}| + |\psi_{r,comp-2}^H \psi_{s,comp-2}| + \ldots + |\psi_{r,comp-n}^H \psi_{s,comp-n}\|^2$ is the square of sum of the magnitudes of the correlation of the modal displacement at each component for the first mode shape vector and the second mode shape vector in the multi-component structure and $(\psi_r^H \psi_r)(\psi_s^H \psi_s)$ is the product of squared magnitudes of the first mode shape vector and the second mode shape vector of the multi-component structure.

22. The modal analysis system of claim 16, wherein the validation tool further scales the first mode shape vector and the second mode shape vector using strain energy weighting factors at each component in the multi-component structure.

23. The modal analysis system of claim 22, wherein the strain energy weighting, factor is computed by dividing strain energy at each component with total strain energy of the multi-component structure.

24. The method of claim 22, wherein the validation tool further scales the first mode shape vector and the second mode shape vector at each component in the multi-component structure using equations:

$$\psi_{r',comp-n} = SE_{comp-n} \psi_{r,comp-n} \text{ and } \psi_{s',comp-n} = SE_{comp-n} \psi_{s,comp-n}$$

wherein, $SE_{comp-n}$ is the strain energy weighting factor of component n, $\psi_{r',comp-n}$ is the scaled first mode shape vector of a component n, $\psi_{s',comp-n}$ is the scaled second mode shape vector of the component n, and n is the number of components in the multi-component structure.

25. The modal analysis system of claim 24, wherein the validation tool further forms the scaled first mode shape vector and scaled the second mode shape vector for the first mode shape and the second mode Shape of the multi-component structure, respectively, using equations:

$$\Psi_{r'} = \begin{Bmatrix} \Psi_{r',comp-1} \\ \Psi_{r',comp-2} \\ \vdots \\ \Psi_{r',comp-n} \end{Bmatrix} \text{ and } \Psi_{s'} = \begin{Bmatrix} \Psi_{s',comp-1} \\ \Psi_{s',comp-2} \\ \vdots \\ \Psi_{s',comp-n} \end{Bmatrix}$$

wherein, $\psi_{r'}$ is the scaled first mode shape vector of the multi-component structure, $\psi_{s'}$ is the scaled second mode shape vector of the multi-component structure, $\psi_{r',comp-n}$ is the scaled first mode shape vector of the component n, $\psi_{r',comp-n}$ is the scaled second mode shape vector of the component n, and n is the number of components in the multi-component structure.

26. The modal analysis system of claim 25, wherein the validation tool further computes a square of sum of magnitudes of correlation of the modal displacement at: each component for the scaled first mode shape vector and the scaled second mode shape vector in the multi-component structure 27. The modal. analysis system of claim 26, wherein the validation tool further computes the square of sum of magnitudes of the correlation of the modal displacement at each component for the scaled first mode shape vector and the scaled second mode shape vector in the multi-component structure using an equation:

$$\|\psi_{r',comp-1}^H \psi_{s',comp-1}| + |\psi_{r',comp-2}^H \psi_{s',comp-2}| + \ldots + |\psi_{r',comp-n}^H \psi_{s',comp-n}\|^2$$

wherein, $\psi_{r',comp-1}^H$ is hermitian transpose of $\psi_{r',comp-n}$.

28. The modal analysis system of claim 26 wherein the validation tool further computes a product of squared magnitudes of the scaled first mode shape vector and the scaled second mode shape vector of the multi-component structure.

29. The modal analysis system of claim 28, wherein the validation tool further computes the product of squared magnitudes of the scaled first mode shape vector and the scaled second mode shape vector of the multi-component structure using an equation:

$$(\psi_{r'}^H \psi_{r'})(\psi_{s'}^H \psi_{s'})$$

wherein, $\psi_{r'}^H$ is hermitian transpose of $\psi_{r'}$ and $\psi_{s'}^H$ is hermitian transpose of $\psi_{s'}$.

30. The modal analysis system of claim 28, wherein the validation tool further computes scaled modal assurance criterion between the scaled first mode shape vector and the scaled second mode shape vector of the multi-component structure by dividing the squared sum of magnitudes of the correlation of the modal displacement at each component for the scaled first mode shape vector and the scaled second mode shape vector in the multi-component structure with the computed product of squared magnitudes of the scaled first mode shape vector and the scaled second mode shape vector of the multi-component structure.

31. The modal analysis system of claim 30, wherein the validation tool further computes the scaled modal assurance criterion between the scaled first mode shape vector and the scaled second mode shape vector of the multi-component structure using an equation:

$$SCMAC(\Psi_{r'}, \Psi_{s'}) = \frac{||\Psi_{r',comp-1}^H \Psi_{s',comp-1}| + |\Psi_{r',comp-2}^H \Psi_{s',comp-2}| + \ldots + |\Psi_{r',comp-n}^H \Psi_{s',comp-n}||^2}{((\Psi_{r'}^H \Psi_{r'})(\Psi_{s'}^H \Psi_{s'}))}$$

wherein, $|||\psi_{r',comp-1}^H \psi_{s',comp-1}| + |\psi_{r',comp-2}^H \psi_{s',comp-2}| + \ldots + |\psi_{r',comp-n}^H \psi_{s',comp-n}|||^2$ is the square of sum of the magnitudes of the correlation of the modal displacement at each component for the scaled first mode shape vector and the scaled second mode shape vector in the multi-component structure and $(\psi_{r'}^H \psi_{r'})(\psi_{s'}^H \psi_{s'})$ is the product of squared magnitudes of the scaled first mode shape vector and the scaled second mode shape vector of the multi-component structure.

32. A non-transitory computer-readable storage medium for comparing two mode shapes of a multi-component structure having instructions that, when executed by a computing device, cause the computing device to:
  form a first mode shape vector and a second mode shape vector for a first mode shape and a second mode shape of the multi-component structure, respectively, by grouping modal displacement at each node associated with each component in the multi-component structure;
  square sum of magnitudes of correlation of the modal displacement at each component for the first mode shape vector and the second mode shape vector in the multi-component structure;
  compute a product of squared magnitudes of the first mode shape vector and the second mode shape vector of the multi-component structure;
  compute modal assurance criterion between the first mode shape vector and the second mode shape vector of the multi-component structure by dividing the squared sum of magnitudes of the correlation of the modal displacement at each component for the first mode shape vector and the second mode shape vector in the multi-component structure with the computed product of squared magnitudes of the first mode shape vector and the second mode shape vector of the multi-component structure; and
  compare the first mode shape and second mode shape of the multi-component structure using the computed modal assurance criterion to identify similarity between the two mode shapes of the multi-component structure.

33. The non-transitory computer-readable storage medium of claim 32, wherein the validation tool further having instructions to:
  scale the first mode shape vector and the second mode shape vector using strain energy weighting factors at each component in the multi-component structure.

34. The non-transitory computer-readable storage medium of claim 33, wherein the strain energy weighting factor is computed by dividing strain energy at each component with total strain energy of the multi-component structure.

\* \* \* \* \*